United States Patent
Yamashita

(10) Patent No.: US 11,808,818 B2
(45) Date of Patent: Nov. 7, 2023

(54) DEGRADATION DETERMINATION DEVICE FOR SECONDARY BATTERY

(71) Applicant: TOYOTA JIDOSHA KABUSHIKI KAISHA, Toyota (JP)

(72) Inventor: Yoshiya Yamashita, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/495,177

(22) Filed: Oct. 6, 2021

(65) Prior Publication Data

US 2022/0113355 A1    Apr. 14, 2022

(30) Foreign Application Priority Data

Oct. 12, 2020   (JP) ................................ 2020-171764

(51) Int. Cl.
  *G01R 31/392*   (2019.01)
  *H01M 10/625*   (2014.01)
  *G01R 31/396*   (2019.01)
  *G01R 31/367*   (2019.01)
  *H01M 10/48*    (2006.01)

(52) U.S. Cl.
  CPC ......... *G01R 31/392* (2019.01); *G01R 31/367* (2019.01); *G01R 31/396* (2019.01); *H01M 10/48* (2013.01); *H01M 10/625* (2015.04)

(58) Field of Classification Search
  CPC .. G01R 31/392; G01R 31/367; G01R 31/396; H01M 10/625; H01M 10/48; B60L 50/16; Y02T 10/70

USPC ...... 324/425–434, 444–450, 500, 600, 76.11
  See application file for complete search history.

(56) References Cited

U.S. PATENT DOCUMENTS

| | | | |
|---|---|---|---|
| 2012/0072062 A1* | 3/2012 | Ando ................... | B60K 6/365 180/65.265 |
| 2014/0210262 A1 | 7/2014 | Yaegaki et al. | |
| 2015/0367748 A1 | 12/2015 | West et al. | |
| 2019/0176639 A1 | 6/2019 | Kumar et al. | |
| 2020/0088797 A1* | 3/2020 | Takahashi ............ | G01R 31/392 |
| 2020/0130530 A1* | 4/2020 | Tsurutani ............... | B60L 58/16 |

FOREIGN PATENT DOCUMENTS

| | | |
|---|---|---|
| EP | 3 346 542 A1 | 7/2018 |
| JP | 2008-076295 A | 4/2008 |

* cited by examiner

*Primary Examiner* — Christopher P McAndrew
*Assistant Examiner* — Trung Q Nguyen
(74) *Attorney, Agent, or Firm* — Sughrue Mion, PLLC

(57) ABSTRACT

A degradation determination device for a secondary battery is used for a hybrid vehicle, and configured to determine degradation of the secondary battery. The hybrid vehicle includes an engine configured to output power, a motor configured to output power, the secondary battery configured to supply electric power to the motor, and a control device configured to execute travel control in which the engine and the motor are controlled. The degradation determination device includes a controller. The controller is configured to determine degradation of the secondary battery based on data of a third parameter in a predetermined period. The third parameter is the difference between a first parameter based on the accelerator operation amount and a second parameter based on a fuel injection amount.

5 Claims, 4 Drawing Sheets

DEGRADATION DETERMINATION DEVICE FOR SECONDARY BATTERY

CROSS-REFERENCE TO RELATED APPLICATION

This application claims priority to Japanese Patent Application No. 2020-171764 filed on Oct. 12, 2020, incorporated herein by reference in its entirety.

BACKGROUND

1. Technical Field

The present disclosure relates to a degradation determination device for a secondary battery. The degradation determination device is used for a hybrid vehicle including an engine, a motor, and a secondary battery, for example.

2. Description of Related Art

There is proposed a degradation determination device for a secondary battery, including a communication terminal device and a server (see Japanese Unexamined Patent Application Publication No. 2008-76295 (JP 2008-76295 A), for example). The communication terminal device includes a constant-current load circuit that keeps a battery current of the secondary battery (battery pack) at a constant current. The communication terminal device detects an internal resistance value by measuring a battery voltage with a battery current of the secondary battery kept at a constant value using the constant-current load circuit, and transmits the detected internal resistance value to the server. The server determines degradation (life) of the secondary battery based on the received internal resistance value. Consequently, degradation of the secondary battery which is operating is determined remotely from the server.

SUMMARY

However, the degradation determination device for a secondary battery discussed above requires the constant-current load circuit in order to detect an internal resistance value of the secondary battery. Therefore, when the degradation determination device for a secondary battery discussed above is used for a hybrid vehicle including an engine and a motor, it is necessary to newly add a constant-current load circuit, which disadvantageously increases the number of parts. In the hybrid vehicle, travel control is executed in which the engine and the motor are controlled using a user operation amount, which is the amount of an operation on an accelerator pedal etc. by a user, and various types of control amounts. Therefore, it is desired to determine degradation of the secondary battery based on the user operation amount and the various types of control amounts which are used for travel control of the hybrid vehicle, without adding a device exclusively for detecting an internal resistance value such as the constant-current load circuit.

The present disclosure provides a degradation determination device for a secondary battery, the degradation determination device determining degradation of the secondary battery based on a user operation amount and a control amount that are used for travel control of a hybrid vehicle.

A first aspect of the present disclosure provides a degradation determination device for a secondary battery, including a controller. The degradation determination device is used for a hybrid vehicle and configured to determine degradation of the secondary battery, the hybrid vehicle including an engine configured to output power for travel, a motor configured to output power for travel, the secondary battery that is configured to supply electric power to the motor, and a control device configured to execute travel control in which the engine and the motor are controlled such that the hybrid vehicle travels while adjusting a fuel injection amount of the engine based on an accelerator operation amount. The controller is configured to determine degradation of the secondary battery based on data of a third parameter in a predetermined period, the third parameter being a difference between a first parameter based on the accelerator operation amount and a second parameter based on the fuel injection amount.

In the first aspect described above, the controller is configured to determine degradation of the secondary battery based on time-series data on the third parameter in the predetermined period, the third parameter being the difference between the first parameter which is based on the accelerator operation amount and the second parameter which is based on the fuel injection amount. The first parameter which is based on the accelerator operation amount may reflect required power required for travel. The second parameter which is based on the fuel injection amount of the engine may reflect power output from the engine. In the hybrid vehicle, power as the difference between the required power and the power from the engine corresponds to electric power input to and output from the secondary battery. Thus, in the first aspect described above, the third parameter, which is the difference between the first parameter and the second parameter, reflects electric power input to and output from the secondary battery. Degradation of the secondary battery is correlated with electric power input to and output from the secondary battery. Thus, degradation of the secondary battery can be determined based on data on the third parameter in the predetermined period. The accelerator operation amount and the fuel injection amount of the engine are a user operation amount and a control amount, respectively, that are used for travel control (control of the engine and the motor) of the hybrid vehicle. Thus, degradation of the secondary battery can be determined using a user operation amount and a control amount that are used to control the hybrid vehicle, by determining degradation of the secondary battery based on data on the third parameter in the predetermined period.

In the first aspect described above, the first parameter may be the accelerator operation amount, and the second parameter may be the proportion of power output from the engine, which is calculated based on the fuel injection amount, to maximum output as the maximum value of power that can be output from the engine.

With the configuration described above, degradation of the secondary battery can be determined more conveniently.

In the first aspect described above, the predetermined period may be a period since a system of the hybrid vehicle is started until the system is stopped.

With the configuration described above, the period for which the accelerator operation amount, the fuel injection amount, and the first to third parameters are stored and held can be shortened compared to a configuration in which the predetermined period is determined as a period since the system of the hybrid vehicle is first started after manufacture until present. Consequently, degradation of the secondary battery can be determined even if no mass storage device is provided.

In the first aspect described above, the controller may be configured to determine that progress of the degradation is faster when a value is large than when the value is small. The value may be obtained by dividing an integrated value of the data on the third parameter in the predetermined period by a travel distance in the predetermined period.

With the configuration described above, degradation can be determined more adequately.

In the first aspect described above, the controller may be configured to determine the degradation based on data of the third parameter in the predetermined period and data of a fourth parameter in the predetermined period, and the fourth parameter may be based on a deceleration amount of the hybrid vehicle. The deceleration amount may reflect braking torque that acts on the hybrid vehicle, that is, electric power regenerated by the motor to be stored in the secondary battery during deceleration. Thus, the fourth parameter may reflect electric power input to the secondary battery during deceleration.

With the configuration described above, degradation can be determined more precisely by determining degradation based on data on the third parameter in the predetermined period and data on the fourth parameter in the predetermined period.

In first aspect described above, the controller may be configured to determine that progress of the degradation is faster when a value is large than when the value is small. The value may be obtained by calculating a sum of an integrated value of the data of the third parameter in the predetermined period and an integrated value of the data of the fourth parameter in the predetermined period and dividing the calculated sum by a travel distance in the predetermined period.

In first aspect described above, degradation can be determined adequately.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Next, a mode for carrying out the present disclosure will be described using an embodiment.

Embodiment

Figure 1:
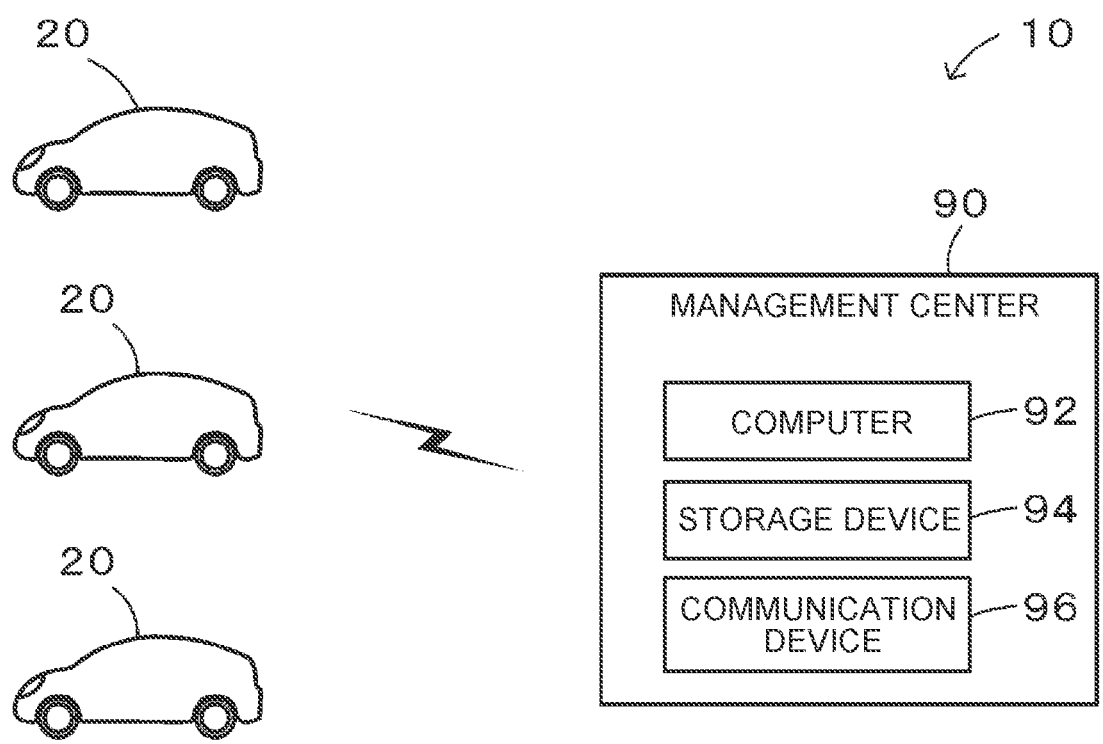
FIG. 1 is a diagram illustrating a schematic configuration of a vehicle diagnosis system 10 that includes a degradation determination device for a secondary battery according to an embodiment of the present disclosure.

FIG. 1 is a diagram illustrating a schematic configuration of a vehicle diagnosis system 10 that includes a degradation determination device for a secondary battery according to an embodiment of the present disclosure. As illustrated in the drawing, the vehicle diagnosis system 10 includes a plurality of hybrid automobiles 20 and a management center 90.

Figure 2:
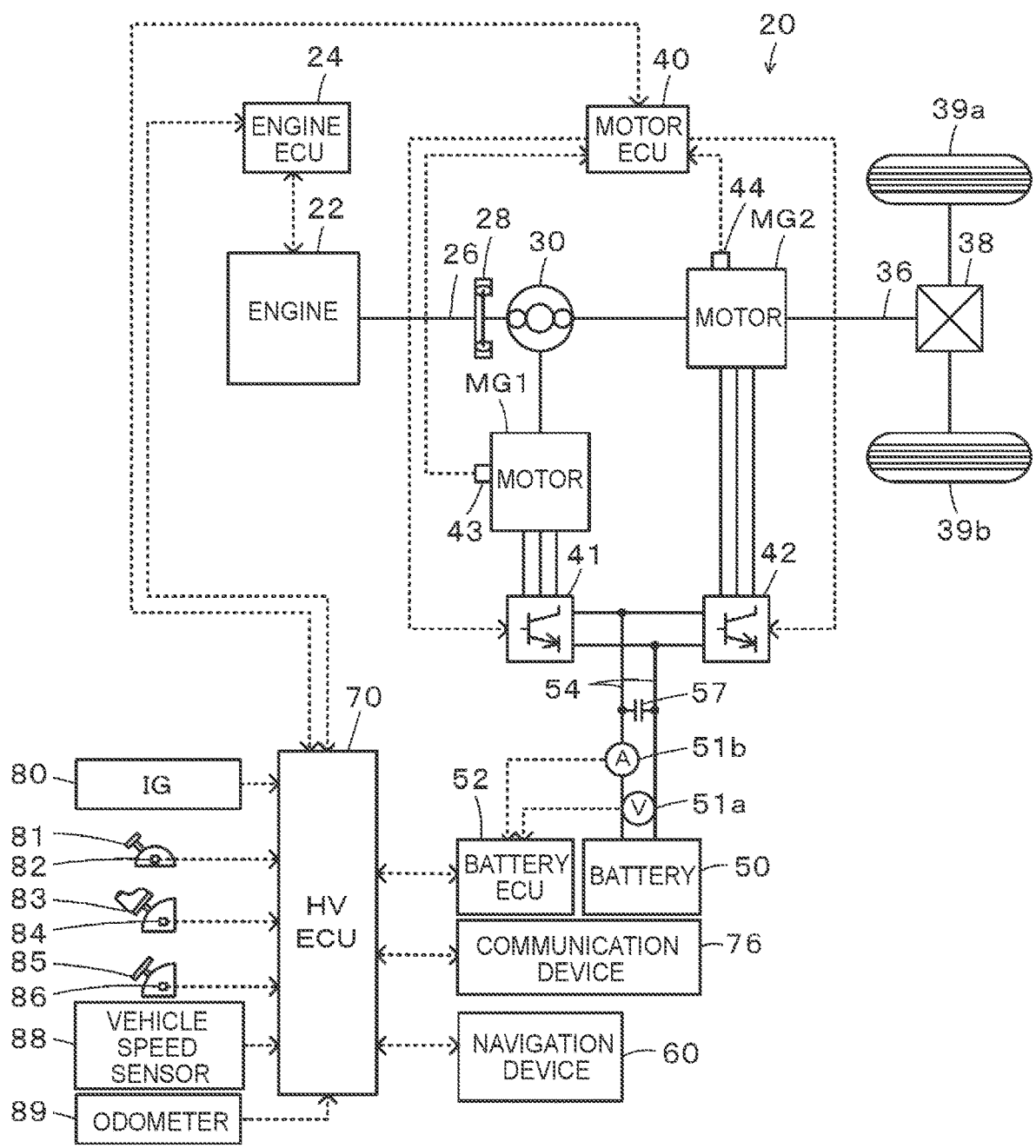
FIG. 2 is a diagram illustrating a schematic configuration of a hybrid automobile 20.

FIG. 2 is a diagram illustrating a schematic configuration of the hybrid automobile 20. As illustrated in the drawing, the hybrid automobile 20 includes an engine 22, a planetary gear 30, motors MG1, MG2, inverters 41, 42, a battery 50, a navigation device 60, and a hybrid electronic control unit (hereinafter referred to as an "HV ECU") 70.

Figure 3:
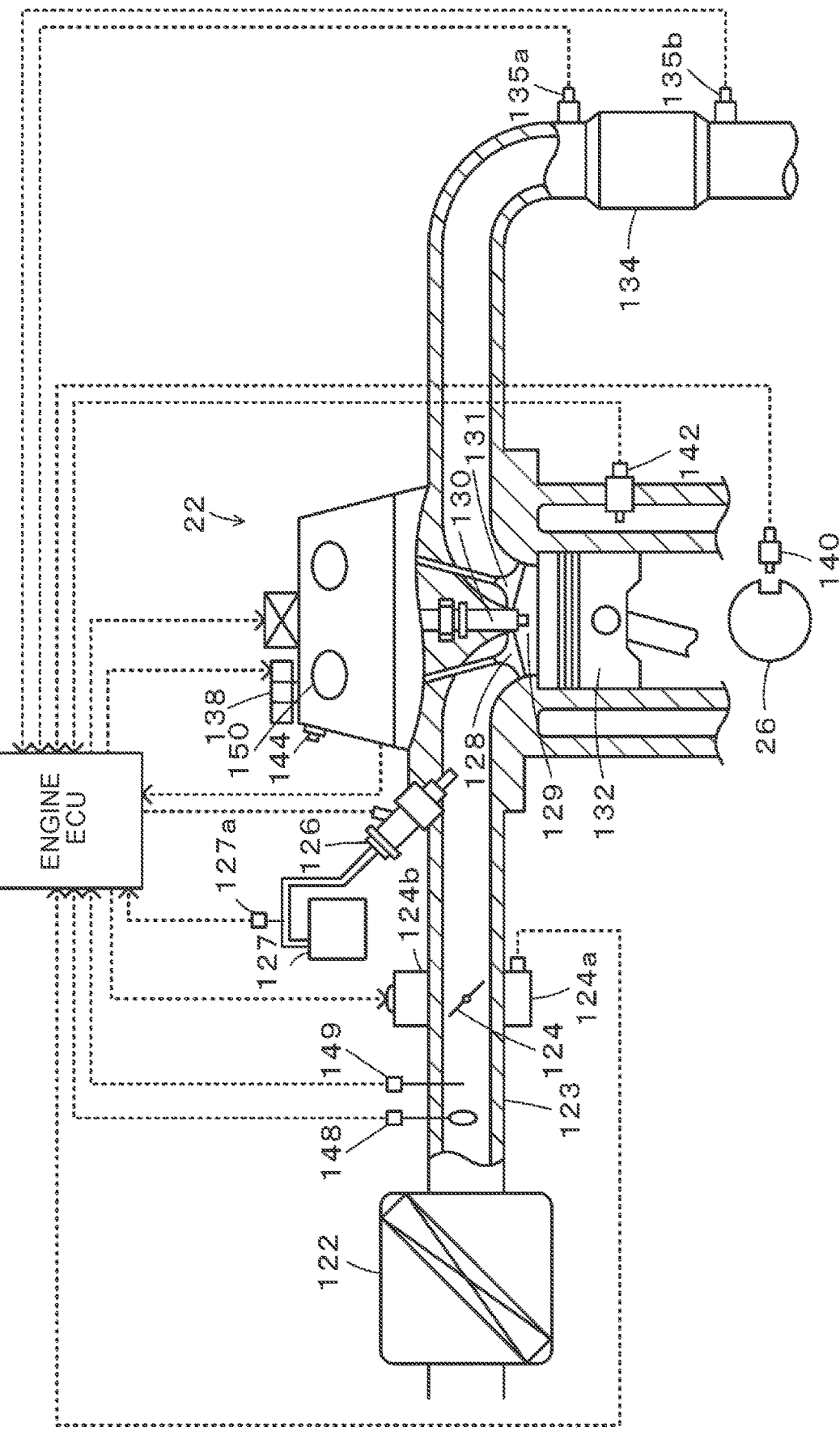
FIG. 3 is a diagram illustrating a schematic configuration of an engine 22.

The engine 22 is constituted as an internal combustion engine that outputs power using gasoline, light oil, etc. as fuel, and connected to a carrier of the planetary gear 30 via a damper 28. FIG. 3 is a diagram illustrating a schematic configuration of the engine 22. As illustrated in the drawing, the engine 22 takes in air cleaned by an air cleaner 122 via a throttle valve 124 disposed in an intake pipe (intake port) 123 and injects fuel from a fuel injection valve 126 to mix the air and the fuel. The air-fuel mixture is taken into a combustion chamber (inside a cylinder) 129 via an intake valve 128. The air-fuel mixture that has been taken in is ignited and combusted by an electric spark generated by a spark plug 130. Reciprocal motion of a piston 132 which is pressed down by the energy of the combustion is converted into rotational motion of a crankshaft 26. Exhaust from the combustion chamber 129 is discharged to the outside via an exhaust gas control device 134 that has an exhaust gas control catalyst (three-way catalyst) that removes harmful components such as carbon monoxide (CO), hydrocarbons (HC), and nitrogen oxides (NOx). Operation of the engine 22 is controlled by an engine electronic control unit (hereinafter referred to as an "engine ECU") 24.

The engine 22 includes a variable valve timing mechanism 150. The variable valve timing mechanism 150 changes an open/close timing VTin of the intake valve 128 with the operation angle maintained, by changing the phase of an intake cam with respect to an intake camshaft.

The engine ECU 24 is constituted as a microprocessor including a central processing unit (CPU) as its main component, and includes a read only memory (ROM) that stores a processing program, a random access memory (RAM) that temporarily stores data, input and output ports, and a communication port, besides the CPU, although not illustrated.

Signals from various sensors required to control operation of the engine 22 are input to the engine ECU 24 via the input port. Examples of the signals from the various sensors include: a crank angle θcr from a crank position sensor 140 that detects the rotational position of the crankshaft 26; a coolant temperature Tw from a coolant temperature sensor 142 that detects the temperature of coolant of the engine 22; a throttle opening degree TH from a throttle valve position sensor 124a that detects the position of the throttle valve 124; a cam position from a cam position sensor 144 that detects the rotational position of a camshaft that opens and closes the intake valve 128 and an exhaust valve 131 that allow air to be taken into and discharged from the combustion chamber 129; an intake air amount Qa from an airflow meter 148 attached to the intake pipe (intake port) 123; an intake air temperature from a temperature sensor 149 also attached to the intake pipe (intake port) 123; an air-fuel ratio AF from an air-fuel ratio sensor 135a; an oxygen signal from an oxygen sensor 135b; and a fuel pressure Pf from a fuel pressure sensor 127a that detects the pressure of fuel in a fuel tank 127.

Various control signals for controlling operation of the engine 22 are output from the engine ECU 24 via the output port. Examples of the various control signals include: a drive control signal for a throttle motor 124b that adjusts the position of the throttle valve 124; a drive control signal for the fuel injection valve 126; a drive control signal for an ignition coil 138 integrated with an ignitor; and a control signal for the variable valve timing mechanism 150.

The engine ECU 24 is connected to the HV ECU 70 via the communication port, and controls operation of the engine 22 in accordance with a control signal from the HV ECU 70. In addition, the engine ECU 24 outputs data related to the operation state of the engine 22 to the HV ECU 70 as necessary. The engine ECU 24 computes the rotational speed of the crankshaft 26, that is, a rotational speed Ne of the engine 22, based on the crank angle θcr. The engine ECU 24 computes a load factor (the ratio of the volume of air actually taken in in one cycle to the piston displacement per one cycle of the engine 22) KL based on the computed rotational speed Ne of the engine 22 and the intake air amount Qa from the airflow meter 148.

The planetary gear 30 is constituted as a single-pinion planetary gear mechanism. A rotor of the motor MG1 is connected to a sun gear of the planetary gear 30. A drive shaft 36, which is coupled to drive wheels 39a, 39b via a differential gear 38, is connected to a ring gear of the planetary gear 30. The crankshaft 26 of the engine 22 is connected to a carrier of the planetary gear 30 via the damper 28.

The motor MG1 is constituted as a synchronous generator/motor, for example. As discussed above, the rotor of the motor MG1 is connected to the sun gear of the planetary gear 30. The motor MG2 is constituted as a synchronous generator/motor, for example. A rotor of the motor MG2 is connected to the drive shaft 36. The inverters 41, 42 are used to drive the motors MG1, MG2, respectively, and connected to the battery 50 via a power line 54. A smoothing capacitor 57 is attached to the power line 54. A motor electronic control unit (hereinafter referred to as a "motor ECU") 40 controls switching of a plurality of switching elements (not illustrated) of the inverters 41, 42 such that the motors MG1 MG2 are rotationally driven, respectively.

The motor ECU 40 is constituted as a microprocessor including a CPU as its main component, and includes a ROM that stores a processing program, a RAM that temporarily stores data, input and output ports, and a communication port, besides the CPU, although not illustrated. The motor ECU 40 receives input of signals from various sensors required to control drive of the motors MG1, MG2, such as rotational positions θm1, θm2 from rotational position detection sensors 43, 44 that detect the rotational positions of the rotors of the motors MG1, MG2, respectively, for example, via the input port. The motor ECU 40 outputs switching control signals for the plurality of switching elements of the inverters 41, 42 etc. via the output port. The motor ECU 40 is connected to the HV ECU 70 via the communication port.

The battery 50 is constituted as a nickel-metal-hydride secondary battery, for example, and connected to the power line 54. The battery 50 is managed by a battery electronic control unit (hereinafter referred to as a "battery ECU") 52.

The battery ECU 52 is constituted as a microprocessor including a CPU as its main component, and includes a ROM that stores a processing program, a RAM that temporarily stores data, input and output ports, and a communication port, besides the CPU, although not illustrated. Signals from various sensors required to manage the battery 50 are input to the battery ECU 52 via the input port. Examples of the signals input to the battery ECU 52 include a voltage Vb of the battery 50 from a voltage sensor 51a attached between the terminals of the battery 50, and a current Ib of the battery 50 from a current sensor 51b attached to an output terminal of the battery 50. The battery ECU 52 is connected to the HV ECU 70 via the communication port.

The navigation device 60 includes a body with a built-in control unit that has a storage medium such as a hard disk that stores map information etc., input and output ports, and a communication port, a global positioning system (GPS) antenna that receives information related to the present location of the vehicle itself, and a touch-panel display that displays information related to the present location of the vehicle itself and various pieces of information such as an expected travel path to a destination and that enables the user to input various instructions, although not illustrated. The map information stores service information (e.g. sightseeing information, parking lots, etc.), road information on travel sections (e.g. between traffic lights, between intersections, etc.), etc. as a database. The road information includes distance information, road width information, lane number information, area information (urban or suburban), type information (general road or highway), gradient information, legal speed, number of traffic lights, etc. The information related to the present location of the vehicle itself includes present position information Gp, which includes the latitude and longitude of the present location, and a GPS time stamp Tgps, which indicates the present time. The navigation device 60 is connected to the HV ECU 70 via the communication port.

The HV ECU 70 is constituted as a microprocessor including a CPU as its main component, and includes a ROM that stores a processing program etc., a RAM that temporarily stores data, a non-volatile memory that stores data, input and output ports, and a communication port, besides the CPU, although not illustrated.

Signals from various sensors are input to the HV ECU 70 via the input port. Examples of the signals input to the HV ECU 70 include an ignition signal Sig from an ignition switch 80 and a shift position SP from a shift position sensor 82 that detects the operation position of a shift lever 81. Other examples include an accelerator operation amount Acc (the proportion of the amount of depression of an accelerator pedal 83 to a maximum depression amount determined in advance as the maximum value of the amount of depression of the accelerator pedal 83, which is 0% when the accelerator pedal 83 is not depressed) from an accelerator pedal position sensor 84 that detects the amount of depression of an accelerator pedal 83, a brake pedal position BP from a brake pedal position sensor 86 that detects the amount of depression of a brake pedal 85, a vehicle speed V from a vehicle speed sensor 88 that detects the vehicle speed, and a travel distance D from an odometer 89 that detects the travel distance accumulated since completion of the vehicle until the present time. Further, signals such as the present position information Gp from the navigation device 60 are input to the HV ECU 70 via the input port.

The HV ECU 70 computes a travel distance Dtrip in the trip (a period since the system of the vehicle is started by turning on the ignition switch 80 until the system of the vehicle is stopped by turning off the ignition switch 80) based on the travel distance D from the odometer 89.

As discussed above, the HV ECU 70 is connected to the engine ECU 24, the motor ECU 40, and the battery ECU 52 via the communication port.

A communication device 76 is constituted as a device that communicates with a communication device 96 of the management center 90. The communication device 76 is connected to the HV ECU 70 via the communication port, and transmits various data from the HV ECU 70 to the management center 90.

The thus configured hybrid automobile 20 travels in an electric travel mode (EV travel mode) in which the hybrid automobile 20 travels without driving the engine 22 and a hybrid travel mode (HV travel mode) in which the hybrid automobile 20 travels while driving the engine 22.

In the EV travel mode, the HV ECU 70 first sets required torque Td*, which is required for travel (required for the drive shaft 36), based on the accelerator operation amount Acc and the vehicle speed V. Subsequently, the HV ECU 70 sets a torque command Tm1* for the motor MG1 to a value of 0, sets a torque command Tm2* for the motor MG2 such that the required torque Td* is output to the drive shaft 36, and transmits the set torque commands Tm1*, Tm2* for the motors MG1, MG2, respectively, to the motor ECU 40. The motor ECU 40 performs switching control on the plurality of switching elements of the inverters 41, 42 such that the motors MG1, MG2 are driven in accordance with the torque commands Tm1*, Tm2*, respectively. The HV ECU 70 executes the process discussed above each predetermined time tref (e.g. several milliseconds etc.).

In the HV travel mode, the HV ECU 70 first sets the required torque Td*, as in the EV travel mode. Subsequently, the HV ECU 70 computes required power Pd*, which is required for travel, by multiplying the required torque Td* by a rotational speed Nd of the drive shaft 36, and computes required power Pe*, which is required for the engine 22, by subtracting charge/discharge required power Pb* (which has a positive value when power is discharged from the battery 50) for the battery 50 from the required power Pd*. Examples of the rotational speed Nd of the drive shaft 36 include a rotational speed Nm2 of the motor MG2 and a rotational speed obtained by multiplying the vehicle speed V by a conversion coefficient. Then, the HV ECU 70 sets a target rotational speed Ne* and target torque Te* for the engine 22 and the torque commands Tm1*, Tm2* for the motors MG1, MG2, respectively, such that the required power Pe* is output from the engine 22 and the required torque Td* is output to the drive shaft 36, transmits the target rotational speed Ne* and the target torque Te* for the engine 22 to the engine ECU 24, and transmits the torque commands Tm1*, Tm2* for the motors MG1, MG2, respectively, to the motor ECU 40. The HV ECU 70 executes the process discussed above each predetermined time tref. The engine ECU 24 performs intake air amount control, fuel injection control, ignition control, etc. on the engine 22 such that the engine 22 is driven based on the target rotational speed Ne* and the target torque Te*. The control performed on the motors MG1, MG2 (inverters 41, 42) by the motor ECU 40 has been discussed above.

In the intake air amount control, the engine ECU 24 sets a target air amount Qa* based on the target torque Te* for the engine 22, sets a target throttle opening degree TH* such that the intake air amount Qa is brought to the target air amount Qa*, and controls the throttle motor 124b such that the throttle opening degree TH of the throttle valve 124 is brought to the target throttle opening degree TH*.

In the fuel injection control, the engine ECU 24 sets a target fuel injection amount Qf* based on the intake air amount Qa such that the air-fuel ratio AF is brought to a target air-fuel ratio AF* (e.g. the stoichiometric air-fuel ratio), computes a valve opening time tfopen of the fuel injection valve 126 from the fuel pressure Pf and the target fuel injection amount Qf*, and controls the fuel injection valve 126 so as to open for the valve opening time tfopen. Then, the engine ECU 24 computes a fuel injection amount Qf from the fuel pressure Pf and the valve opening time tfopen, and transmits the fuel injection amount Qf to the HV ECU 70.

In the ignition control, the engine ECU 24 sets a target ignition timing Tf* based on the rotational speed Ne and the target torque Te* for the engine 22, and controls the spark plug 130 such that ignition is performed at the target ignition timing Tf*.

The management center 90 includes a computer 92 that serves as a management server, a storage device 94, and the communication device 96. The computer 92 has a main storage unit such as a ROM that stores a processing program and a RAM that temporarily stores data, input and output ports, a communication port, etc., besides a processor. The processor may be a central processing unit (CPU), a digital signal processor (DSP), etc. The processor performs various computations for information processing. The storage device 94 is constituted as an auxiliary storage unit such as a hard disk or a solid state drive (SSD), for example, and stores an operating system (OS), various programs, various tables, etc. The processor loads a program stored in the auxiliary storage unit to a work area of the main storage unit, executes the program, and controls the various constituent units etc. through execution of the program. The main storage unit and the auxiliary storage unit are each a computer-readable storage medium. Information stored in the auxiliary storage unit may be stored in the main storage unit. Meanwhile, information stored in the main storage unit may be stored in the auxiliary storage unit. The storage device 94 stores map information that is identical to the map information stored in the navigation device 60 of each hybrid automobile 20. The communication device 96 communicates with the communication device 76 of each hybrid automobile 20. The computer 92, the storage device 94, and the communication device 96 are connected to each other via a signal line.

Next, operation of the thus configured vehicle diagnosis system 10, in particular operation for determining the remaining life (degradation) of the battery 50, will be described. Operation of the hybrid automobile 20 will be described first, and operation of the management center 90 will be described next.

The communication device 76 of each hybrid automobile 20 transmits, to the management center 90, a vehicle identification number VIN, a detection time Time, the rotational speed Ne of the engine 22, the fuel injection amount Qf, the accelerator operation amount Acc, and the vehicle speed V each predetermined time tref since the ignition switch 80 is turned on until the ignition switch 80 is turned off. The vehicle identification number VIN is a number assigned to individual vehicles in order to identify the individual vehicles (e.g. a 17-letter code composed of alphabets and numerals). The detection time Time is obtained by receiving the GPS time stamp Tgps received by the navigation device 60 through communication via the HV ECU 70. The rotational speed Ne of the engine 22 and the fuel injection amount Qf are obtained by receiving those computed by the engine ECU 24 through communication via the HV ECU 70. The accelerator operation amount Acc is obtained by receiving that detected by the accelerator pedal position sensor 84 through communication via the HV ECU 70. The vehicle speed V is obtained by receiving that detected by the vehicle speed sensor 88 through communication via the HV ECU 70.

When the ignition switch 80 is turned off, the communication device 76 of each hybrid automobile 20 transmits the vehicle identification number VIN of the vehicle itself, the travel distance Dtrip in the trip, and a vehicle weight Mhv to the management center 90. The travel distance Dtrip is obtained by receiving that computed based on the travel distance D from the odometer 89 through communication via the HV ECU 70. The vehicle weight Mhv is obtained by receiving that stored in the ROM (not illustrated) of the HV ECU 70 as a value indicated in the specifications through communication.

Next, operation of the management center 90 will be described. A process of storing data from the hybrid automobile 20 in the storage device 94 of the management center 90 will be described first, and a process of determining the remaining life (degradation) of the battery 50 will be described next.

The communication device 96 of the management center 90 receives the vehicle identification number VIN, the detection time Time, the rotational speed Ne of the engine 22, the fuel injection amount Qf, the accelerator operation amount Acc, and the vehicle speed V, which are transmitted from each hybrid automobile 20 each predetermined time tref, and transmits such data to the computer 92 as a time-series data set. The communication device 96 receives the vehicle identification number VIN, the travel distance Dtrip, and the vehicle weight Mhv, which are transmitted from each hybrid automobile 20 when the ignition switch 80 is turned off, and transmits such data to the computer 92 as a non-time-series data set.

When the time-series data set is received, the computer 92 saves the received time-series data set in the storage device 94. When a time-series data set including the identical vehicle identification number VIN is received the next time, the computer 92 saves the time-series data set received next in a different storage area without overwriting time-series data sets that have been saved. Through such processing, time-series data sets are accumulated in the storage device 94 each predetermined time tref.

When the non-time-series data set is received, the computer 92 saves the received non-time-series data set in the storage device 94. The non-time-series data set includes the vehicle identification number VIN, the travel distance Dtrip, and the vehicle weight Mhv, which are received from the hybrid automobile 20 when the ignition switch 80 is turned off. Thus, the computer 92 determines that the system of the vehicle is stopped with the ignition switch 80 of the hybrid automobile 20 turned off at the timing when the non-time-series data set is received. Then, when a time-series data set including the same vehicle identification number VIN is input after that, it is determined that the system of the vehicle is started with the ignition switch 80 of the hybrid automobile 20 corresponding to the vehicle identification number VIN turned on, and the input time-series data set is saved in the storage device 94 after deleting all the time-series data sets corresponding to the vehicle identification number VIN, among the time-series data sets saved in the storage device 94. Through such processing, k (the value k is a natural number of 2 or more) time-series data sets for one trip of each hybrid automobile 20 are saved in the storage device 94 for a period since the ignition switch 80 of the hybrid automobile 20 is turned off until the ignition switch 80 is turned on the next time.

Figure 4:
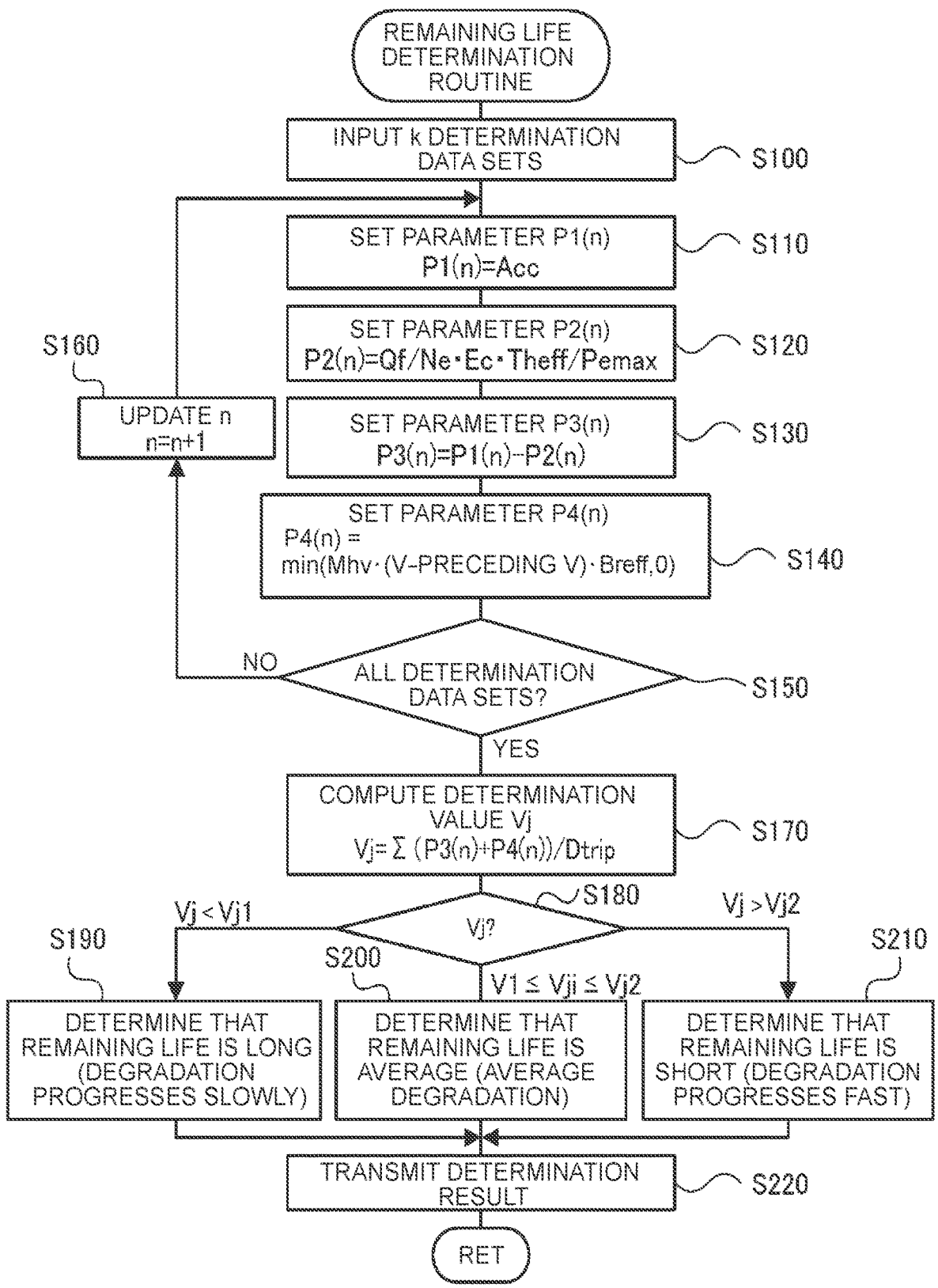
FIG. 4 is a flowchart illustrating an example of a remaining life determination routine executed by a computer 92 of a management center 90.

When a non-time-series data set including the vehicle identification number VIN of the hybrid automobile 20 as the target for determination of the remaining life (degradation) of the battery 50 is received, the computer 92 of the management center 90 determines the remaining life (degradation) of the battery 50 using the k time-series data sets for one trip corresponding to the vehicle identification number VIN saved in the storage device 94 and the non-time-series data set. FIG. 4 is a flowchart illustrating an example of a remaining life determination routine executed by the computer 92. The routine is executed when a non-time-series data set is received.

When the routine is executed, the computer 92 of the management center 90 executes a process of receiving input of k time-series data sets, including the vehicle identification number VIN as the target for determination of the remaining life (degradation) of the battery 50, from the storage device 94 in the order of the detection time Time from the older side as k determination data sets (step S100).

Subsequently, a parameter (first parameter) P1($n$) is set to the accelerator operation amount Acc included in the determination data set with the n-th oldest detection time Time, among the k determination data sets (step S110). n is a natural number with a value of 1 or more and k or less. The initial value of n is set to a value of 1. Thus, when step S110 is first executed, the parameter P1(1) is set to the accelerator operation amount Acc included in the oldest determination data set, among the k determination data sets. In the HV travel mode, as discussed above, the hybrid automobile 20 is controlled so as to travel using the required power Pd* which is set using the required torque Td* which is based on the accelerator operation amount Acc. Thus, the parameter P1($n$) reflects required power required for travel at the corresponding detection time Time.

Next, a parameter (second parameter) P2($n$) is computed based on the fuel injection amount Qf included in the n-th oldest determination data set, the rotational speed Ne of the engine 22, and the following formula (1) (step S120). In the formula (1), "Ec" is the amount of heat (energy) generated when a unit mass of fuel is combusted. "Theff" is the thermal efficiency of the engine 22. "Pemax" is the maximum output determined in advance through experiments, analyses, etc. as the maximum value of power that can be output from the engine 22. From the formula (1), the parameter P2($n$) reflects power output from the engine 22 at the corresponding detection time Time.

$$P2(n)=Qf/Ne \cdot Ec \cdot Theff/Pe\max \tag{1}$$

Then, a parameter (third parameter) P3($n$) is set to a value obtained by subtracting the parameter P2($n$) from the parameter P1($n$) (step S130). The parameter P1($n$) reflects required power required for travel at the corresponding detection time Time. The parameter P2($n$) reflects power output from the engine 22 at the corresponding detection time Time. Thus, the parameter P3($n$), which is obtained by subtracting the parameter P2($n$) from the parameter P1($n$), reflects electric power input to and output from the motor MG2, that is, electric power input to and output from the battery 50, at the corresponding detection time Time.

Subsequently, a parameter P4($n$) is set to the smaller one of a value of 0 and a value (=Mhv·(V−preceding V)·Breff) obtained by multiplying the vehicle weight Mhv, which is included in the non-time-series data set, by a deceleration amount (=V−preceding V), which is obtained by subtracting the vehicle speed V (preceding V) included in the determination data set input in the (n−1)-th order from the vehicle speed V included in the determination data set input in the n-th order, and a regeneration efficiency Breff of the motor MG2 (step S140). When step S140 is first executed, the initial value of the preceding V is set to a value of 0. The value (=Mhv·(V−preceding V)·Breff) indicates electric power regenerated by the motor MG2 to be stored in the battery 50 during deceleration. From the formula (2), the parameter P4($n$) is set to a value of 0 during acceleration, and to electric power regenerated by the motor MG2 to be stored in the battery 50 during deceleration. Thus, the parameter P4(n) reflects electric power input to the battery 50 at the corresponding detection time Time.

$$P4(n) = \min(Mhv \cdot (V - \text{preceding } V) \cdot Breff, 0) \quad (2)$$

When the parameters P3(n), P4(n) are set in this manner, it is determined whether the parameters P3(n), P4(n) have been set for all the input determination data sets, that is, parameters P3(1) to P3(k), P4(1) to P4(k) have been set as time-series data in the trip (step S150). When the parameters P3(1) to P3(k), P4(1) to P4(k) have not been set, n is incremented by a value of 1 (n is increased by 1 to be updated) (step S160), and the process returns to step S110 to execute step S110 and the subsequent steps. In this manner, steps S110 to S160 are repeatedly performed until the parameters P3(n), P4(n) have been set for all the input determination data sets.

When the parameters P3(1) to P3(k), P4(1) to P4(k) have been set in step S150, a determination value Vj is set to a value obtained by dividing an integrated value of the sum of the parameter P3(n) and the parameter P4(n) in the trip by the travel distance Dtrip using the parameters P3(1) to P3(k), P4(1) to P4(k) and the following formula (3) (step S170). As discussed above, the parameters P3(n), P4(n) reflect electric power output from the battery 50 (a positive value), and electric power input to the battery 50 during deceleration (a value of 0 or less), at the corresponding detection time Time. Thus, the determination value Vj reflects the integrated value of electric power input to and output from the battery 50 per unit travel distance in the trip.

$$Vj = \Sigma(P3(n) + P4(n))/Dtrip \quad (3)$$

When the determination value Vj is set in this manner, a comparison is made between the determination value Vj and thresholds Vj1, Vj2 (step S180). The threshold Vj1 is a threshold for determining whether the remaining life of the battery 50 is shorter than the average remaining life (whether degradation of the battery 50 progresses more slowly in the future than the average). The threshold Vj2 is a threshold for determining whether the remaining life of the battery 50 is longer than the average remaining life (whether degradation of the battery 50 progresses faster in the future than the average). The threshold Vj2 is set to a value that is larger than the threshold Vj1. The average remaining life (average value of degradation) is a value obtained by determining the average life in advance through experiments, analyses, etc. as the average life of the battery 50 for a case where the user uses the hybrid automobile 20 in an average manner and subtracting the number of days that have elapsed since the start of use of the hybrid automobile 20 after manufacture from the determined average life. The remaining life of the battery 50 is strongly correlated with an integrated value of electric power input to and output from the battery 50, and the remaining life of the battery 50 is shorter when electric power input to and output from the battery 50 is larger than when such electric power is smaller, since degradation of the battery 50 progresses faster in the future. Thus, it can be determined whether the remaining life (degradation) of the battery 50 is long or short by comparing the determination value Vj and the thresholds Vj1, Vj2.

When the determination value Vj is less than the threshold Vj1 in step S180, it is determined that degradation of the battery 50 progresses more slowly in the future than the average, and it is determined that the remaining life is long (step S190). When the determination value Vj is equal to or more than the threshold Vj1 and equal to or less than the threshold Vj2, it is determined that degradation of the battery 50 transitions in an average manner in the future, and it is determined that the remaining life is average (step S200). When the determination value Vj is more than the threshold Vj2, it is determined that degradation of the battery 50 progresses faster in the future than the average, and it is determined that the remaining life is short (step S210). The parameters P3(1) to P3(k), P4(1) to P4(k) are set using the rotational speed Ne of the engine 22, the fuel injection amount Qf, the accelerator operation amount Acc, and the vehicle speed V. As discussed above, the rotational speed Ne of the engine 22, the fuel injection amount Qf, the accelerator operation amount Acc, and the vehicle speed V are each a user operation amount or a control amount to be used for control (travel control) of the engine 22 and the motors MG1, MG2 in the HV travel mode. Thus, degradation of the battery 50 can be determined precisely using the user operation amounts and the control amounts which are used for travel control of the hybrid automobile 20 without adding a special device for determining the remaining life of the battery 50.

The remaining life (degradation) of the battery 50 can be determined using the parameters P3(1) to P3(k), P4(1) to P4(k) for one trip. Thus, the storage capacity of the storage device 94 can be reduced compared to a configuration in which all the parameters P3, P4 are stored for a period since the system of the hybrid automobile 20 is first started after manufacture until present. Thus, degradation of the secondary battery can be determined even if no mass storage device is provided.

The inventors have found that if the battery 50 is constituted as a nickel-metal-hydride secondary battery, it is difficult to predict progress of degradation of the battery 50 based on an internal resistance value of the nickel-metal-hydride secondary battery, since the internal resistance value increases abruptly with degradation of the battery 50 progressing abruptly when the time of use exceeds a certain time. In the embodiment, degradation of the battery 50 is determined using the user operation amounts and the control amounts which are used for travel control of the hybrid automobile 20. Thus, degradation can be determined precisely even if the battery 50 is constituted as a nickel-metal-hydride secondary battery.

When the remaining life (degradation) of the battery 50 is determined in this manner, the determination result and the corresponding vehicle identification number VIN are transmitted to the communication device 96 (step S220). When the determination result and the vehicle identification number VIN are received, the communication device 96 transmits the determination result to the hybrid automobile 20 corresponding to the received vehicle identification number VIN. When the determination result is received, the hybrid automobile 20 indicates degradation in the vehicle on a display (not illustrated). Consequently, the user can be informed of degradation of the battery 50, and the user can be prompted to replace the battery 50 when the remaining life of the battery 50 is short.

With the vehicle diagnosis system 10 including the degradation determination device for a secondary battery according to the embodiment described above, degradation of the battery 50 can be determined using a user operation amount and a control amount that are used for travel control of the hybrid automobile 20, by determining the remaining life (degradation) of the battery 50 based on the parameters P3(1) to P3(k), which are data on the parameter P3(n) in the trip, and the parameters P4(1) to P4(k), which are data on the parameter P4(n) in the trip, the parameter P3(n) being the difference between the parameter P1(n) which is based on the accelerator operation amount Acc and the parameter P2(n) which is based on the fuel injection amount Qf, and the parameter P4(n) being based on the deceleration amount of the hybrid automobile 20.

In addition, progress of degradation can be determined more adequately, by determining that degradation progresses faster when a value obtained by calculating the sum of an integrated value of the parameters P3(1) to P3(k) which are data on the parameter P3(n) in the trip and an integrated value of the parameters P4(1) to P4(k) which are data on the parameter P4(n) in the trip and dividing the calculated sum by the travel distance Dtrip in the trip is larger, than when such a value is smaller.

In the vehicle diagnosis system 10 including the degradation determination device for a secondary battery according to the embodiment, the parameter P1(n) is set to the accelerator operation amount Acc in step S110 of the remaining life determination routine in FIG. 4. However, the parameter P1(n) may be set to the required power Pd* which is obtained by multiplying the required torque Td*, which is based on the accelerator operation amount Acc and the vehicle speed V, by the rotational speed Nd of the drive shaft 36. In this case, the following formula (4) may be used in place of the formula (1) in step S120.

$$P2(n) = Qf/Ne \cdot Ec \cdot Theff/Pe \max \quad (4)$$

In the vehicle diagnosis system 10 including the degradation determination device for a secondary battery according to the embodiment, the parameters P3(1) to P3(k), P4(1) to P4(k) are set in steps S130, S140, respectively, of the remaining life determination routine in FIG. 4, and the determination value Vj is set using the set parameters P3(1) to P3(k), P4(1) to P4(k) in step S170. However, step S140 may not be executed, and the determination value Vj may be set using only the parameters P3(1) to P3(k). In this case, the following formula (5) may be used in place of the formula (3) discussed above in step S170.

$$Vj = \Sigma P3(n)/Dtrip \quad (5)$$

In the vehicle diagnosis system 10 including the degradation determination device for a secondary battery according to the embodiment, the remaining life (speed of progress of degradation) is determined in three steps based on the determination value Vj in steps S180 to S210 of the remaining life determination routine in FIG. 4. However, it is only necessary to determine that degradation progresses faster and the remaining life is shorter when the determination value Vj is larger than when the determination value Vj is smaller, and thus the remaining life (speed of progress of degradation) may be determined in four steps or more.

In the vehicle diagnosis system 10 including the degradation determination device for a secondary battery according to the embodiment, the remaining life (degradation) of the battery 50 is determined based on the parameters P3(1) to P3(k), P4(1) to P4(k) which are time-series data on the parameters P3(n), P4(n), respectively, for one trip. However, the period for which time-series data on the parameters P3(n), P4(n) are collected is not limited to one trip, and may be two trips or more, and may be determined as appropriate. For example, when each hybrid automobile 20 is in service as a taxi, the remaining life (degradation) of the battery 50 may be determined based on time-series data on the parameters P3(n), P4(n) for the number of hours for which the taxi is in service in one day.

In the vehicle diagnosis system 10 including the degradation determination device for a secondary battery according to the embodiment, the determination value Vj is computed based on the parameters P3(1) to P3(k), P4(1) to P4(k) which are time-series data on the parameters P3(n), P4(n), respectively. However, it is not always necessary to prepare k time-series data on the parameters P3(n), P4(n). The remaining life (degradation) of the battery 50 may be determined based on the parameter P3 (=P1−P2) and the parameter P4 (=min(Mhv·(V−preceding V)·Breff,0)) in one trip, the parameter P3 being the difference between the parameter P1 which is based on the accelerator operation amount Acc of the engine 22 and the parameter P2 which is based on the fuel injection amount Qf. In this case, the determination value Vj may be computed as an integrated value of a value obtained by each hybrid automobile 20 transmitting the rotational speed Ne of the engine 22, the fuel injection amount Qf, the accelerator operation amount Acc, and the vehicle speed V to the management center 90 each predetermined time tref, the management center 90 setting the parameters P1 (=Acc), P2 (=Qf/Ne·Ec·Theff/Pemax), P3 (=P1−P2), and P4 (=min(Mhv·(V−preceding V)·Breff,0)) upon each reception of the rotational speed Ne of the engine 22, the fuel injection amount Qf, the accelerator operation amount Acc, and the vehicle speed V, and dividing the sum of the parameter P3 and the parameter P4 by the travel distance Dtrip, as indicated by the following formula (6). In this case, setting of the parameters P1 to P4 and computation of the determination value Vj may be executed by the hybrid automobile 20.

$$Vj = \Sigma(P3(n) + P4(n)/Dtrip \quad (6)$$

In the vehicle diagnosis system 10 including the degradation determination device for a secondary battery according to the embodiment, the computer 92 of the management center 90 executes the remaining life determination routine in FIG. 4. However, some or all of the processes of the remaining life determination routine in FIG. 4 may be executed by the HV ECU 70 of the hybrid automobile 20.

In the vehicle diagnosis system 10 including the degradation determination device for a secondary battery according to the embodiment, the battery 50 is constituted as a nickel-metal-hydride secondary battery. However, the battery 50 may be a secondary battery, and may be a lithium-ion battery, for example.

In the embodiment, the degradation determination device for a secondary battery according to the present disclosure is mounted on the management center 90. However, the degradation determination device for a secondary battery according to the present disclosure may be mounted on the hybrid automobile 20.

In the embodiment, the degradation determination device for a secondary battery according to the present disclosure is applied to the hybrid automobile 20 which includes the engine 22, the motors MG1, MG2, and the planetary gear 30. However, the thus configured hybrid automobile 20 is not limiting, and the degradation determination device for a secondary battery according to the present disclosure may be applied to a hybrid automobile 20 with a different configuration, as long as the hybrid automobile includes an engine that outputs power for travel, a motor that outputs power for travel, and a secondary battery that exchanges electric power with the motor. The degradation determination device for a secondary battery according to the present disclosure may also be applied to vehicles other than automobiles, such as trains and construction machines.

In the embodiment, the engine 22 is an example of the "engine", the motor MG2 is an example of the "motor", the battery 50 is an example of the "secondary battery", the engine ECU 24, the motor ECU 40, and the HV ECU 70 are examples of the "control device", the hybrid automobile 20 is an example of the "hybrid vehicle", and the computer 92 of the management center 90 is an example of the "degradation determination device for a secondary battery".

The present disclosure may also be implemented by supplying a computer program that implements the function described in relation to the above embodiment to a vehicle ECU or a computer, and one or more processors of the vehicle ECU or the computer reading and executing the program. Such a computer program may be provided to a computer by a computer-readable non-transitory storage medium that is connectable to a system bus of the computer, or may be provided to the computer via a network. The computer-readable non-transitory storage medium may include a disk of any type such as a magnetic disk (such as a floppy disk and a hard disk drive) and an optical disk (such as a compact disc read only memory (CD-ROM), a digital versatile disc (DVD), and a Blu-ray disc), a read only memory (ROM), a random access memory (RAM), an erasable programmable read only memory (EPROM), an electrically erasable programmable read only memory (EEPROM), a magnetic card, a flash memory, an optical card, and any type of medium suitable for storing an electronic commands.

While a mode for carrying out the present disclosure has been described above using an embodiment, the present disclosure is not limited to the embodiment in any way. It is a matter of course that the present disclosure may be implemented in a variety of modes without departing from the scope and spirit of the present disclosure.

The present disclosure may be applied to the industry of manufacturing degradation determination devices for a secondary battery etc.

What is claimed is:

1. A degradation determination device for a secondary battery, the degradation determination device being used for a hybrid vehicle and configured to determine degradation of the secondary battery, the hybrid vehicle including: an engine configured to output power for travel; a motor configured to output power for travel; the secondary battery that is configured to supply electric power to the motor; and a control device configured to execute travel control in which the engine and the motor are controlled such that the hybrid vehicle travels while adjusting a fuel injection amount of the engine based on an accelerator operation amount, the degradation determination device comprising:
a controller configured to determine degradation of the secondary battery based on data of a third parameter in a predetermined period, the third parameter being a difference between:
a first parameter reflecting required power which is based on the accelerator operation amount; and
a second parameter reflecting power output from the engine which is based on the fuel injection amount.

2. The degradation determination device according to claim 1, wherein the predetermined period is a period since a system of the hybrid vehicle is started until the system is stopped.

3. The degradation determination device according to claim 1, wherein:
the controller is configured to determine that progress of the degradation is faster when a value is large than when the value is small; and
the value is obtained by dividing an integrated value of the third parameter in the predetermined period by a travel distance in the predetermined period.

4. The degradation determination device according to claim 1, wherein the controller is configured to determine the degradation based on data of the third parameter in the predetermined period and data of a fourth parameter in the predetermined period, and the fourth parameter is based on a deceleration amount of the hybrid vehicle.

5. The degradation determination device according to claim 4, wherein:
the controller is configured to determine that progress of the degradation is faster when a value is large than when the value is small; and
the value is obtained by calculating a sum of an integrated value of the data of the third parameter in the predetermined period and an integrated value of the data of the fourth parameter in the predetermined period and dividing the calculated sum by a travel distance in the predetermined period.

* * * * *